(12) United States Patent
Zeng (10) Patent No.: US 10,685,988 B2
(45) Date of Patent: Jun. 16, 2020

(54) DISPLAY PANEL HAVING CONNECTION LINE CONNECTED TO END PORTIONS OF SCAN LINES AND MANUFACTURING METHOD THEREOF, AND DISPLAY DEVICE

(71) Applicant: Wuhan China Star Optoelectronics Technology Co., Ltd., Wuhan, Hubei (CN)

(72) Inventor: Shuanghua Zeng, Hubei (CN)

(73) Assignee: WUHAN CHINA STAR OPTOELECTRONICS TECHNOLOGY CO., LTD., Wuhan, Hubei (CN)

(*) Notice: Subject to any disclaimer, the term of this patent is extended or adjusted under 35 U.S.C. 154(b) by 0 days.

(21) Appl. No.: 15/764,662

(22) PCT Filed: Feb. 2, 2018

(86) PCT No.: PCT/CN2018/075140
§ 371 (c)(1),
(2) Date: Mar. 29, 2018

(87) PCT Pub. No.: WO2019/127847
PCT Pub. Date: Jul. 4, 2019

(65) Prior Publication Data
US 2019/0206906 A1 Jul. 4, 2019

(30) Foreign Application Priority Data
Dec. 28, 2017 (CN) .......................... 2017 1 1456897

(51) Int. Cl.
*H01L 27/12* (2006.01)
*H01L 29/786* (2006.01)
(Continued)

(52) U.S. Cl.
CPC ...... *H01L 27/1244* (2013.01); *H01L 27/0248* (2013.01); *H01L 27/124* (2013.01);
(Continued)

(58) Field of Classification Search
CPC .................................................. H01L 27/1244
See application file for complete search history.

(56) References Cited

U.S. PATENT DOCUMENTS

| 8,823,913 B2 | 9/2014 | Jin et al. |
| 2007/0090410 A1* | 4/2007 | Chen ................. H01L 27/0251 257/223 |
| 2010/0110050 A1 | 5/2010 | Park et al. |

FOREIGN PATENT DOCUMENTS

| CN | 1195117 | 10/1998 |
| CN | 101846828 A | 9/2010 |

(Continued)

*Primary Examiner* — Lex H Malsawma
*Assistant Examiner* — Laura M Dykes
(74) *Attorney, Agent, or Firm* — Leong C. Lei (57) ABSTRACT

A display panel includes a plurality of scan lines and connection lines. The plurality of scan lines are spaced from each other. The connection lines are connected to end portions of the plurality of scan lines. The connection lines are formed of intrinsic silicon. By having the connection lines that are formed of intrinsic silicon connected with the end portions of all the scan lines, due to intrinsic silicon being almost electrically non-conductive, this does not affect stage by stage activation of the scan lines and provides a way of power consumption by large resistivity of intrinsic silicon for preventing static electricity on end portions of the scan lines thereby overcoming the issue of static electricity being easily caused on the end portions of the scan lines and thus enhancing product quality.

13 Claims, 4 Drawing Sheets

(51) Int. Cl.
  *H01L 29/66* (2006.01)
  *H01L 27/02* (2006.01)
  *G02F 1/1362* (2006.01)
  *H01L 27/32* (2006.01)
  *G02F 1/1368* (2006.01)
  *G02F 1/1333* (2006.01)
  *G02F 1/1345* (2006.01)

(52) U.S. Cl.
  CPC ........ *H01L 27/127* (2013.01); *H01L 27/1222* (2013.01); *H01L 27/1262* (2013.01); *H01L 29/66757* (2013.01); *H01L 29/78675* (2013.01); *G02F 1/1368* (2013.01); *G02F 1/13452* (2013.01); *G02F 1/133345* (2013.01); *G02F 1/136204* (2013.01); *G02F 1/136286* (2013.01); *G02F 2001/13685* (2013.01); *G02F 2001/136295* (2013.01); *G02F 2202/104* (2013.01); *H01L 27/3262* (2013.01); *H01L 27/3276* (2013.01); *H01L 2227/323* (2013.01)

(56) References Cited

FOREIGN PATENT DOCUMENTS

| | | | |
|---|---|---|---|
| CN | 102331644 | | 1/2012 |
| CN | 103021945 | | 4/2013 |
| CN | 104218042 | A | 12/2014 |
| CN | 106449664 | | 2/2017 |
| CN | 106449664 | A  * | 2/2017 |
| KR | 20150015608 | | 2/2015 |

* cited by examiner

DISPLAY PANEL HAVING CONNECTION LINE CONNECTED TO END PORTIONS OF SCAN LINES AND MANUFACTURING METHOD THEREOF, AND DISPLAY DEVICE

RELATED APPLICATIONS

The present application is a National Phase of International Application Number PCT/CN2018/075140, filed Feb. 2, 2018, and claims the priority of China Application No. 201711456897.9, filed Dec. 28, 2017.

BACKGROUND OF THE INVENTION

1. Field of the Invention

The present invention relates to the field of technology for manufacturing liquid crystal panel, and more particularly to a display panel and a manufacturing method thereof, and a display device.

2. The Related Arts

Figure 1:
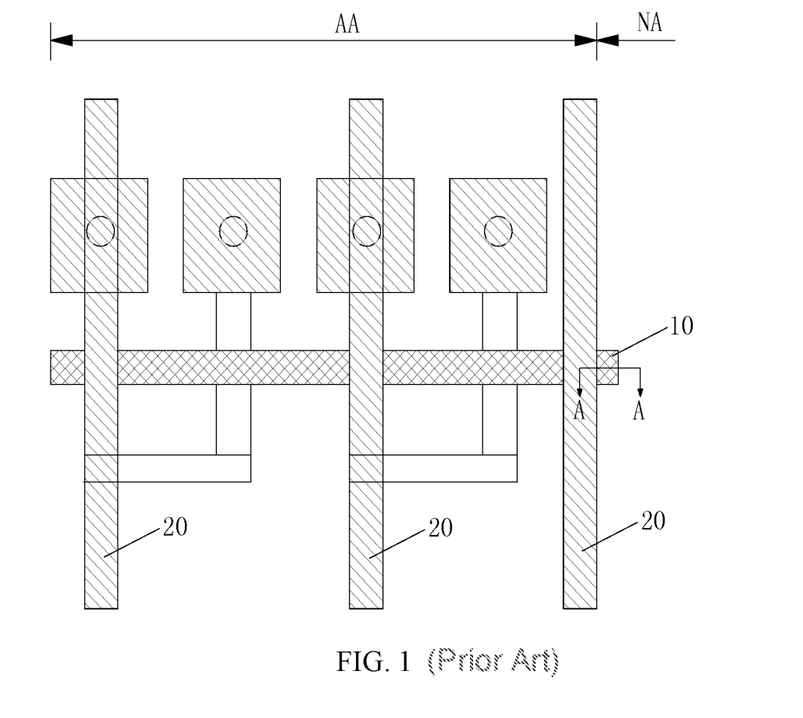
FIG. 1 is a schematic view showing a structure of a conventional display panel.
Figure 2:
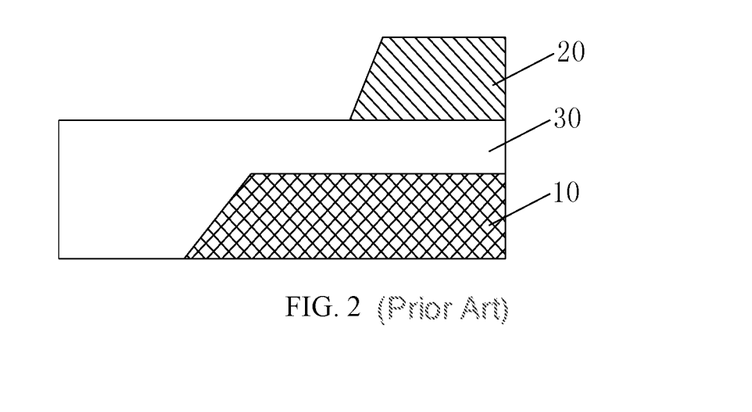
FIG. 2 is a cross-sectional view taken along line A-A of FIG. 1.

In a known way of designing a low-temperature poly-silicon display panel that is currently available, end portions of scan lines that extend from a display area to a non-display area are arranged in a floating form without being mounted to any support. FIG. 1 is a schematic view showing a structure of a conventional display panel. As shown in FIG. 1, a scan line 10 has an end portion that extends from a display area AA to a non-display area NA. A second metal layer 20 that forms data lines is provided on the end portion of the scan line 10. FIG. 2 is a cross-sectional view taken along line A-A of FIG. 1. As shown in FIG. 2, electric discharge at a tip of the end portion of the scan line 10 may readily cause electrostatic discharge (ESD) damage. The second metal layer 20 is of an arrangement of being perpendicular to the scan line. For an edge of the second metal layer 20 that is close, in distance, to the end portion of the scan line 10, due to damage of a dielectric insulation layer 30 caused by electrostatic discharge at the tip of the end portion of the scan line 10, shorting may occur between the second metal layer 20 and the scan line 10, leading to different signals of the scan line 10 and the second metal layer 20 being shorted to each other and eventually causing display abnormality. Among the damages, certain minor damages cannot be easily detected and missed in an inspection operation and consequently, a loss of yield rate of the display panel may result, causing undesired influence on success rate of product sampling.

SUMMARY OF THE INVENTION

To overcome the above problem of the prior art, an object of the present invention is to provide a display panel that prevents damages of insulation layer caused by electrostatic discharge at a tip of an end portion of a scan line and a manufacturing method thereof, and also a display device.

According to an aspect of the present invention, a display panel is provided, comprising a plurality of scan lines and connection lines, the plurality of scan lines being arranged parallel to each other, the connection lines being connected to end portions of the plurality of scan lines, the connection lines being formed of intrinsic silicon.

Further, the display panel further comprises a plurality of connection conductor layers, the end portions of the plurality of scan lines corresponding and connected, in a one by one manner, to the plurality of connection conductor layers, the connection lines being connected to the plurality of connection conductor layers.

Further, the display panel further comprises a first dielectric insulation layer and a second dielectric insulation layer, the first dielectric insulation layer being arranged on the connection lines, the plurality of scan lines being arranged on the first dielectric insulation layer, the second dielectric insulation layer being arranged on the plurality of scan lines and the first dielectric insulation layer, the plurality of connection conductor layers being arranged on the second dielectric insulation layer, each of the connection conductor layers extending through the second dielectric insulation layer to connect to the end portion of a corresponding one of the scan lines, each of the connection conductor layers extending through the second dielectric insulation layer and the first dielectric insulation layer to connect to the connection lines.

Further, the display panel further comprises a plurality of pixels and a plurality of data lines, the plurality of data lines being arranged parallel to each other, the data lines and the scan lines intersecting each other to define a plurality of pixel zones, each of the pixel zones comprising a corresponding one of the pixels formed therein, the pixels comprising at least one thin-film transistor connected to a corresponding one of the scan lines and a corresponding one of the data lines.

Further, the thin-film transistor comprises: an active layer, which is formed, simultaneously with the connection lines, of intrinsic poly-silicon; a source electrode and a drain electrode, which are respectively arranged on two sides of the active layer; the first dielectric insulation layer being also arranged on the active layer, the source electrode and the drain electrode; the gate electrode, which is formed, simultaneously with the scan lines, on the first dielectric insulation layer, the gate electrode being connected to a corresponding one of the scan lines, the second dielectric insulation layer being also arranged on the gate electrode; and a source contact layer and a drain contact layer, which are formed, simultaneously with the connection conductor layers and the data lines, on the second dielectric insulation layer, the source contact layer and the drain contact layer extending through the second dielectric insulation layer and the first dielectric insulation layer to respectively contact the source electrode and the drain electrode, the source contact layer being connected to a corresponding one of the data lines.

Further, the pixels further comprise a liquid crystal cell or an organic light-emitting diode connected to the thin-film transistor.

According to another aspect of the present invention, a display device is also provided, which comprises the above-described display panel.

According to a further aspect of the present invention, a manufacturing method of a display panel is provide, comprising: Step 1: providing a base plate, wherein the base plate comprises a display area and a non-display area; Step 2: forming, in the non-display area, connection lines with intrinsic poly-silicon; Step 3: forming, in the display area and the non-display area, a first dielectric insulation layer, the first dielectric insulation layer being arranged on the connection lines; Step 4: forming, in the display area, a plurality of scan lines having end portions extending into the non-display area, the scan lines being arranged on the first dielectric insulation layer; Step 5: forming, in the display area and the non-display area, a second dielectric insulation layer, the second dielectric insulation layer being arranged on a plurality of the scan lines and the first dielectric insulation layer; Step 6: simultaneously forming, in the non-display area, a plurality of first vias and a plurality of second vias in the second dielectric insulation layer, such that each of the first vias exposes the end portion of a corresponding one of the scan lines and the plurality of second vias extend through the first dielectric insulation layer to expose the connection lines; and Step 7: forming, in the non-display area, a plurality of connection conductor layers on the second dielectric insulation layer, each of the connection conductor layers being set in contact and thus connection with the end portion of a corresponding one of the scan lines by way of a corresponding one of the first vias, each of the connection conductor layers being set in contact and connection with the connection lines by way of a corresponding one of the second vias.

Further, in Step 2, an active layer, a source electrode and a drain electrode are also formed in the display area, the active layer being formed of intrinsic poly-silicon; in Step 3, the first dielectric insulation layer being also arranged on the active layer, the source electrode and the drain electrode; in Step 4, a gate electrode is also formed in the display area and arranged on the first dielectric insulation layer, the gate electrode being connected to a corresponding one of the scan lines; in Step 5, the second dielectric insulation layer is also arranged on the gate electrode; and in Step 7, a source contact layer, a drain contact layer and a plurality of data lines are also formed in the display area and arranged on the second dielectric insulation layer, the source contact layer and the drain contact layer extending through the second dielectric insulation layer and the first dielectric insulation layer to respectively contact the source electrode and the drain electrode, the source contact layer being connected to a corresponding one of the data lines.

Further, the manufacturing method further comprises: forming a liquid crystal cell or an organic light-emitting diode connecting and contacting the drain contact layer.

The efficacy of the present invention is that connection lines that are made of intrinsic silicon are connected to end portions of all scan lines. Since intrinsic silicon is almost electrically non-conductive, this does not affect stage by stage activation of the scan lines and provides a way of power consumption by large resistivity of intrinsic silicon for preventing static electricity on end portions of the scan lines thereby overcoming the issue of static electricity being easily caused on the end portions of the scan lines and thus enhancing product quality.

BRIEF DESCRIPTION OF THE DRAWINGS

The above and other aspects, features, and advantages of embodiments of the present invention will become more apparent with reference to the illustration provided below in combination with the attached drawing. In the drawings.

DETAILED DESCRIPTION OF THE PREFERRED EMBODIMENTS

Embodiments of the present invention will be described below. However, these embodiments can be put into practice in various forms and this invention should not be construed as being limited to such embodiments. Oppositely, these embodiments are provided just for the purpose of explaining the principle of this invention and practical applications thereof, in order to allow skilled persons of this field to appreciate various embodiments of this invention and various modifications thereof that suit to specific predetermined applications.

In the drawings, for clear illustration, thickness of layers and areas may be exaggerated. Throughout the entire disclosure and drawings, similar reference numerals are used to designate the same elements.

Figure 3:
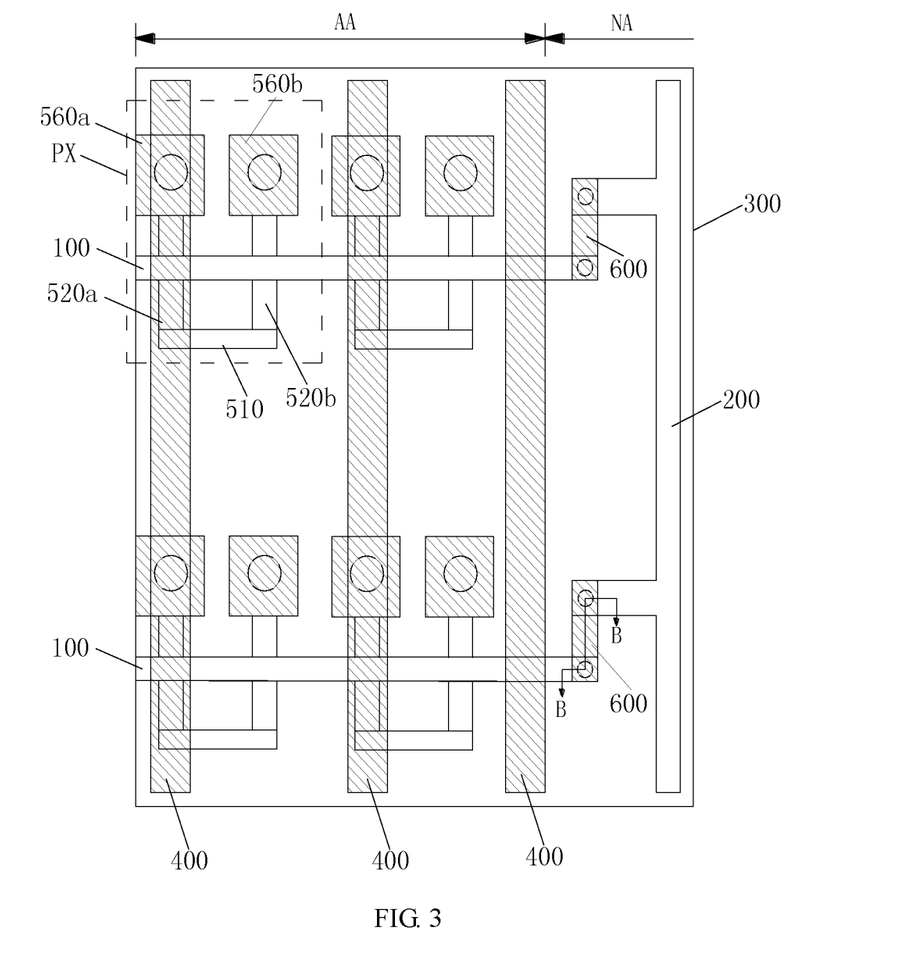
FIG. 3 is a schematic view showing a structure of a display panel according to an embodiment of the present invention.

FIG. 3 is a schematic view showing a structure of a display panel according to an embodiment of the present invention.

Referring to FIG. 3, a display panel according to an embodiment of the present invention comprises a plurality of scan lines 100 and connection lines 200. The plurality of scan lines 100 are arranged parallel to each other. The connection lines 200 are connected to end portions of the plurality of scan lines. The connection lines 200 are made of intrinsic poly-silicon.

Since intrinsic silicon is almost electrically non-conductive, this does not affect stage by stage activation of the scan lines 100 and provides a way of power consumption by large resistivity of intrinsic silicon for preventing static electricity on end portions of the scan lines 100 thereby overcoming the issue of static electricity being easily caused on the end portions of the scan lines 100 and thus enhancing product quality.

Further, the display panel according to the embodiment of the present invention further comprises a plurality of connection conductor layers 600. The end portion of each of the scan lines 100 corresponds to one of the connection conductor layers 600 that is connected to the connection line 200.

Further, the display panel according to the embodiment of the present invention further comprises a base plate 300, a plurality of data lines 400, and a plurality of pixels PX.

The base plate 300 is generally divided into a display area AA and a non-display area NA located at one side of the display area AA. The plurality of scan lines 100 are arranged, in parallel, in the display area AA and extend to the non-display area NA, wherein the end portion of each of the scan lines 100 extends into the non-display area NA. The plurality of data lines 400 are also arranged, in parallel, in the display area AA and the data lines 400 intersect the scan lines 100 to define a plurality of pixel zones. Each of the pixels PX is arranged in a corresponding one of the pixel zones. Each of the pixels PX comprises, at least, a thin-film transistor and a liquid crystal cell or an organic light-emitting diode connected to the thin-film transistor.

In FIG. 3, three data lines 400, two scan lines 100, and four pixel zones defined thereby are shown; however, this invention is not limited to what shown in FIG. 3.

Figure 4:
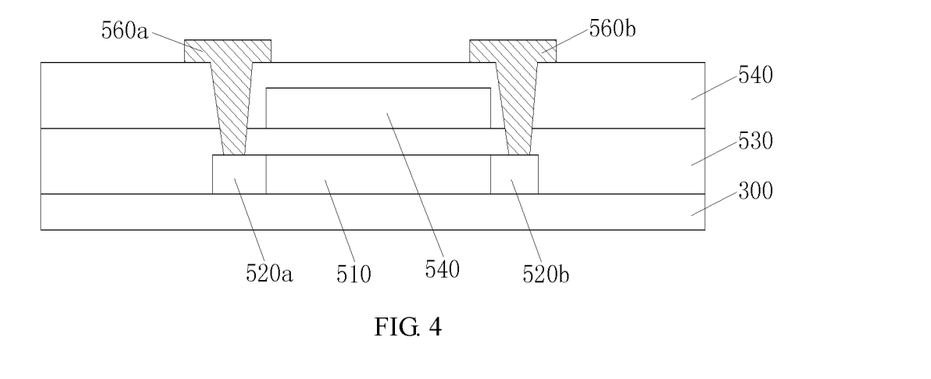
FIG. 4 is a side elevational view showing a thin-film transistor according to an embodiment of the present invention.

A description of a structure of the thin-film transistors of the display area AA will be first given below. FIG. 4 is a side elevational view of the thin-film transistor according to an embodiment of the present invention.

Referring to FIGS. 3 and 4, the thin-film transistor according to the embodiment of the present invention comprises: an active layer 510, which is arranged on a base plate 300; a source electrode 520a and a drain electrode 520b, which are respectively arranged on two sides of the active layer 510; a first dielectric insulation layer 530, which is arranged on the active layer 510, the source electrode 520a, and the drain electrode 520b; a gate electrode 540, which is formed, simultaneously with the scan lines 100, on the first dielectric insulation layer 530, the gate electrode 540 being connected to a corresponding one of the scan lines 100; a second dielectric insulation layer 550, which is arranged on the gate electrode 540 and the first dielectric insulation layer 530; a source contact layer 560a and a drain contact layer 560b, which are formed, simultaneously with the data lines 400, on the second dielectric insulation layer 550, the source contact layer 560a and the drain contact layer 560b extending through the second dielectric insulation layer 550 and the first dielectric insulation layer 530 to respectively contact the source electrode 520a and the drain electrode 520b, the source contact layer 560a being connected to a corresponding one of the data lines 400.

Further, it is noted here that after the manufacturing of the thin-film transistor is completed, the liquid crystal cell or the organic light-emitting diode that is connected to the thin-film transistor can then be manufactured.

Figure 5:
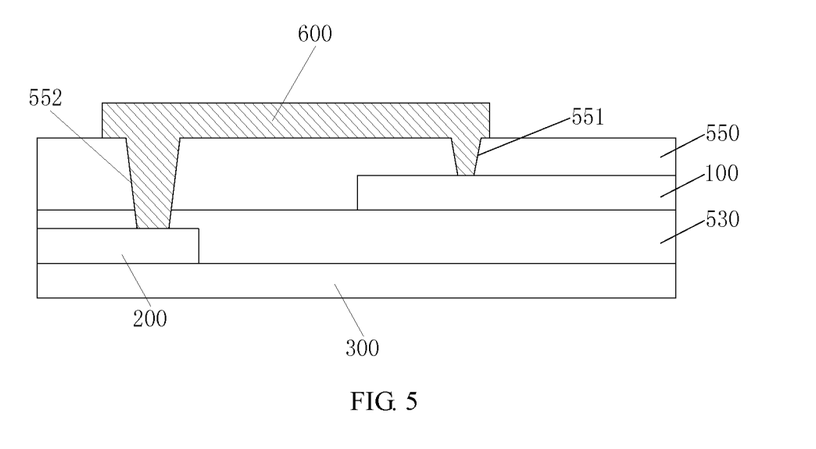
FIG. 5 is a cross-sectional view taken along line B-B of FIG. 3.

FIG. 5 is a cross-sectional view taken along line B-B of FIG. 3. Referring to FIG. 5, the connection lines 200 is arranged on the base plate 300. Here, the connection lines 200 are formed of intrinsic poly-silicon, at the same time with the active layer 510. The first dielectric insulation layer 530 extends into the non-display area AA is arranged on the connection lines 200. The end portions of the scan lines 100 are arranged on the first dielectric insulation layer 530. The second dielectric insulation layer 550 extends into the non-display area AA and is arranged on the end portions of the scan lines 100. The second dielectric insulation layer 550 is formed therein with a first via 551 and a second via 552, such that the first via 551 expose the end portion of the scan line 100 and the second via 552 extends through the first dielectric insulation layer 530 to expose the connection line 200. The connection conductor layers 600 are formed of the same material of and at the same time with the source contact layer 560a and the drain contact layer 560b and the connection conductor layers 600 are each located on the second dielectric insulation layer 550. The connection conductor layers 600 are each set, by way of the first via 551 and the second via 552, in contact engagement with the end portion of one of the scan lines 100 and one of the connection line 200, so that the plurality of connection conductor layers 600 connect the end portions of the plurality of scan lines 100 to the connection lines 200.

Further, the present invention also provides a display device, which comprises the display panel shown in FIG. 3, a scan driver that transmits signals to the scan lines 100, and a data driver that transmits signals to the data lines 400. Certainly, the display device of the present invention may further comprise other necessary components, such as a timing controller that control the scan driver and the data driver.

Figure 6:
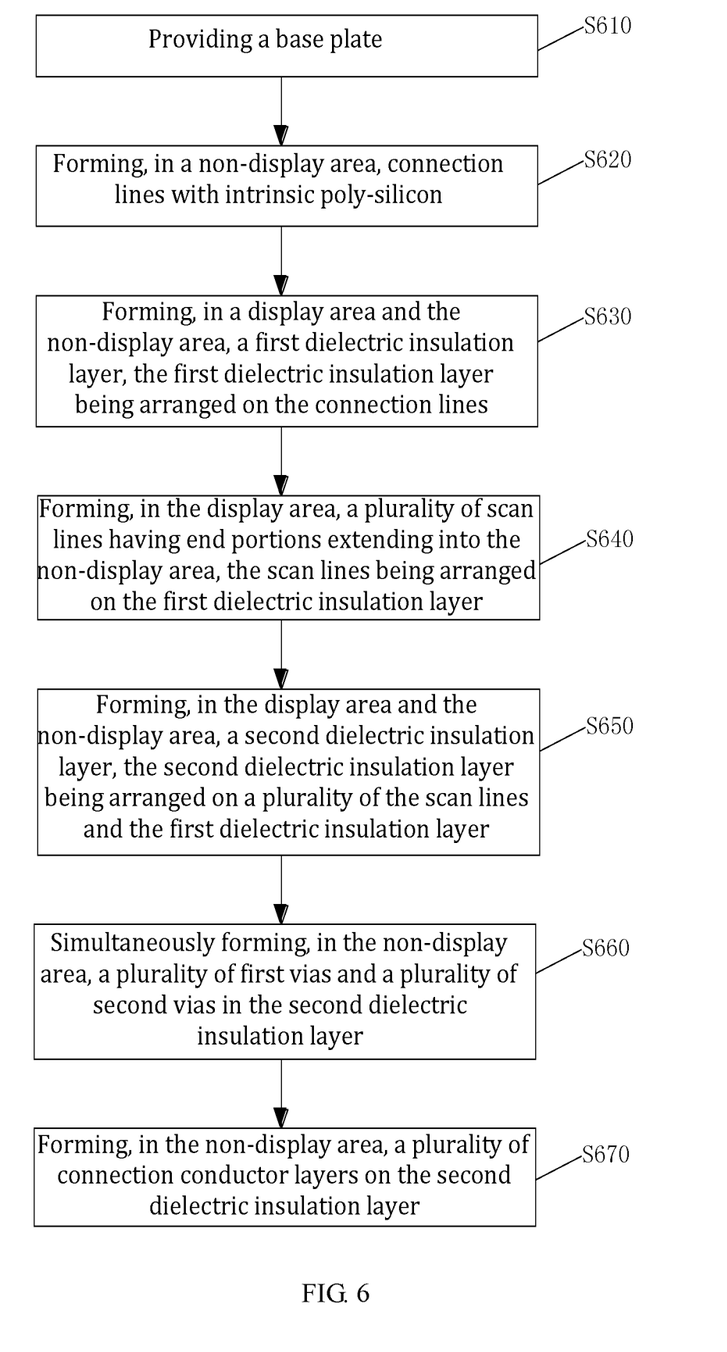
FIG. 6 is a flow chart illustrating a manufacturing method of a display panel according to an embodiment of the present invention.

FIG. 6 is a flow chart illustrating a manufacturing method of a display panel according to an embodiment of the present invention.

Referring to FIG. 6, with additional reference being had to FIGS. 3-5, the manufacturing method of a display panel according to an embodiment of the present invention comprises:

Step S610: providing a base plate 300. The base plate 300 is generally divided into a display area AA and a non-display area NA located at one side of the display area AA.

Step S620: forming connection lines 200 with intrinsic poly-silicon in the non-display area NA, and at the same time, forming am active layer 510, a source electrode 520a, and a drain electrode 520b in the display area AA.

Step S630: forming a first dielectric insulation layer 530 in the non-display area NA and the display area AA, wherein the first dielectric insulation layer 530 is arranged on the connection lines 200, and also the first dielectric insulation layer 530 is arranged on the active layer 510, the source electrode 520a, and the drain electrode 520b.

Step S640: forming, in the display area AA, a plurality of scan lines 100 having end portions extending to the non-display area NA, wherein the scan lines 100 are arranged on the first dielectric insulation layer 530, and also, forming, in the display area AA, a gate electrode 540 that is arranged on the first dielectric insulation layer 530, wherein the gate electrode 540 is connected to a corresponding one of the scan lines 100.

Step S650: forming a second dielectric insulation layer 550 in the display area AA and the non-display area NA, wherein the second dielectric insulation layer 550 is arranged on the plurality of scan lines 100 and the first dielectric insulation layer 530, and the second dielectric insulation layer 550 is also arranged on the gate electrode 540.

Step S660: simultaneously forming, in the non-display area NA, a plurality of first vias 551 and a plurality of second vias 552 in the second dielectric insulation layer 550, wherein each of the first vias 551 expose the end portion of a corresponding one of the scan lines 110 and the a plurality of second vias 552 extend through the first dielectric insulation layer 530 to respectively expose the connection lines 200.

Step S670: forming, in the non-display area NA, a plurality of connection conductor layers 600 on the second dielectric insulation layer 550, wherein each of the connection conductor layers 600 is set, by way of a corresponding one of the first vias 551, in contact engagement with the end portion of a corresponding one of the scan lines 100 and each of the connection conductor layers 600 is set, by way of a corresponding one of the second vias 552, in contact engagement with the connection lines 200, and at the same time, forming, in the display area AA, a source contact layer 560a, a drain contact layer 560b and a plurality of data lines 400 that are arranged on the second dielectric insulation layer 550, wherein the source contact layer 560a and the drain contact layer 560b extend through the second dielectric insulation layer 550 and the first dielectric insulation layer 530 to contact with the source electrode 520a and the drain electrode 520b, the source contact layer 560a being connected to a corresponding one of the data lines 400.

In summary, according to the embodiments of the present invention, connection lines that are made of intrinsic silicon are connected to end portions of all scan lines. Since intrinsic silicon is almost electrically non-conductive, this does not affect stage by stage activation of the scan lines and provides a way of power consumption by large resistivity of intrinsic silicon for preventing static electricity on end portions of the scan lines thereby overcoming the issue of static electricity being easily caused on the end portions of the scan lines and thus enhancing product quality.

Although a description has been given to the present invention with reference to specific embodiments, it is appreciated by those having ordinary skills in the field that various modifications in respect of form and detail can be made without departing from the spirit and scope of this invention as defined in the appended claims and equivalents thereof.

What is claimed is:

1. A display panel, comprising a plurality of scan lines and connection lines, the plurality of scan lines being parallel with each other as all extending in a first direction and spaced from each other in a second direction that is different from the first direction such that the scan lines are co-extensive with each other, the connection lines being arranged to extend in the second direction and connected to end portions of the plurality of scan lines, the connection lines being formed of intrinsic silicon;

wherein multiple ones of the scan lines that are co-extensive with each other are arranged to have the end portions of the multiple co-extensive scan lines connected to a single block of intrinsic silicon of a single one of the connection lines such that the single block intrinsic silicon of the single one of the connection lines is connected to the end portions of the multiple co-extensive scan lines.

2. The display panel according to claim 1, wherein the display panel further comprises a plurality of connection conductor layers, the end portions of the plurality of scan lines corresponding and connected, in a one by one manner, to the plurality of connection conductor layers, the connection lines being connected to the plurality of connection conductor layers.

3. The display panel according to claim 2, wherein the display panel further comprises a first dielectric insulation layer and a second dielectric insulation layer, the first dielectric insulation layer being arranged on the connection lines, the plurality of scan lines being arranged on the first dielectric insulation layer, the second dielectric insulation layer being arranged on the plurality of scan lines and the first dielectric insulation layer, the plurality of connection conductor layers being arranged on the second dielectric insulation layer, each of the connection conductor layers extending through the second dielectric insulation layer to connect to the end portion of a corresponding one of the scan lines, each of the connection conductor layers extending through the second dielectric insulation layer and the first dielectric insulation layer to connect to the connection lines.

4. The display panel according to claim 3, wherein the display panel further comprises a plurality of pixels and a plurality of data lines, the plurality of data lines being arranged parallel to each other, the data lines and the scan lines intersecting each other to define a plurality of pixel zones, each of the pixel zones comprising a corresponding one of the pixels formed therein, the pixels comprising at least one thin-film transistor connected to a corresponding one of the scan lines and a corresponding one of the data lines.

5. The display panel according to claim 4, wherein the thin-film transistor comprises:

an active layer, which is formed, simultaneously with the connection lines, of intrinsic poly-silicon;
a source electrode and a drain electrode, which are respectively arranged on two sides of the active layer; the first dielectric insulation layer being also arranged on the active layer, the source electrode and the drain electrode;
a gate electrode, which is formed, simultaneously with the scan lines, on the first dielectric insulation layer, the gate electrode being connected to a corresponding one of the scan lines, the second dielectric insulation layer being also arranged on the gate electrode; and
a source contact layer and a drain contact layer, which are formed, simultaneously with the connection conductor layers and the data lines, on the second dielectric insulation layer, the source contact layer and the drain contact layer extending through the second dielectric insulation layer and the first dielectric insulation layer to respectively contact the source electrode and the drain electrode, the source contact layer being connected to a corresponding one of the data lines.

6. The display panel according to claim 4, wherein the pixels further comprise a liquid crystal cell or an organic light-emitting diode connected to the thin-film transistor.

7. The display panel according to claim 2, wherein the display panel further comprises a plurality of pixels and a plurality of data lines, the plurality of data lines being arranged parallel to each other, the data lines and the scan lines intersecting each other to define a plurality of pixel zones, each of the pixel zones comprising a corresponding one of the pixels formed therein, the pixels comprising at least one thin-film transistor connected to a corresponding one of the scan lines and a corresponding one of the data lines.

8. The display panel according to claim 7, wherein the thin-film transistor comprises:

an active layer, which is formed, simultaneously with the connection lines, of intrinsic poly-silicon;
a source electrode and a drain electrode, which are respectively arranged on two sides of the active layer; the first dielectric insulation layer being also arranged on the active layer, the source electrode and the drain electrode;
a gate electrode, which is formed, simultaneously with the scan lines, on the first dielectric insulation layer, the gate electrode being connected to a corresponding one of the scan lines, the second dielectric insulation layer being also arranged on the gate electrode; and
a source contact layer and a drain contact layer, which are formed, simultaneously with the connection conductor layers and the data lines, on the second dielectric insulation layer, the source contact layer and the drain contact layer extending through the second dielectric insulation layer and the first dielectric insulation layer to respectively contact the source electrode and the drain electrode, the source contact layer being connected to a corresponding one of the data lines.

9. The display panel according to claim 7, wherein the pixels further comprise a liquid crystal cell or an organic light-emitting diode connected to the thin-film transistor.

10. A display device, comprising a display panel according to claim 1.

11. A manufacturing method of a display panel, comprising:

Step 1: providing a base plate, wherein the base plate comprises a display area and a non-display area;
Step 2: forming, in the non-display area, connection lines with intrinsic poly-silicon;
Step 3: forming, in the display area and the non-display area, a first dielectric insulation layer, the first dielectric insulation layer being arranged on the connection lines;

Step 4: forming, in the display area, a plurality of scan lines having end portions extending into the non-display area, the scan lines being arranged on the first dielectric insulation layer, wherein the plurality of scan lines are parallel with each other as all extending in a first direction and spaced from each other in a second direction that is different from the first direction such that the scan lines are co-extensive with each other, and wherein the connection lines are arranged to extend in the second direction;

Step 5: forming, in the display area and the non-display area, a second dielectric insulation layer, the second dielectric insulation layer being arranged on a plurality of the scan lines and the first dielectric insulation layer;

Step 6: simultaneously forming, in the non-display area, a plurality of first vias and a plurality of second vias in the second dielectric insulation layer, such that each of the first vias exposes the end portion of a corresponding one of the scan lines and the plurality of second vias extend through the first dielectric insulation layer to expose the connection lines; and Step 7: forming, in the non-display area, a plurality of connection conductor layers on the second dielectric insulation layer, each of the connection conductor layers being set in contact and thus connection with the end portion of a corresponding one of the scan lines by way of a corresponding one of the first vias, each of the connection conductor layers being set in contact and connection with the connection lines by way of a corresponding one of the second vias;

wherein multiple ones of the scan lines that are co-extensive with each other are arranged to have the end portions of the multiple co-extensive scan lines connected to a single block of intrinsic silicon of a single one of the connection lines such that the single block intrinsic silicon of the single one of the connection lines is connected to the end portions of the multiple co-extensive scan lines.

12. The manufacturing method of the display panel according to claim 11, wherein
- in Step 2, an active layer, a source electrode and a drain electrode are also formed in the display area, the active layer being formed of intrinsic poly-silicon;
- in Step 3, the first dielectric insulation layer being also arranged on the active layer, the source electrode and the drain electrode;
- in Step 4, a gate electrode is also formed in the display area and arranged on the first dielectric insulation layer, the gate electrode being connected to a corresponding one of the scan lines;
- in Step 5, the second dielectric insulation layer is also arranged on the gate electrode; and
- in Step 7, a source contact layer, a drain contact layer and a plurality of data lines are also formed in the display area and arranged on the second dielectric insulation layer, the source contact layer and the drain contact layer extending through the second dielectric insulation layer and the first dielectric insulation layer to respectively contact the source electrode and the drain electrode, the source contact layer being connected to a corresponding one of the data lines.

13. The manufacturing method of the display panel according to claim 12, wherein the manufacturing method further comprises: forming a liquid crystal cell or an organic light-emitting diode connecting and contacting the drain contact layer.

* * * * *